(12) United States Patent
Lee

(10) Patent No.: US 7,268,090 B2
(45) Date of Patent: Sep. 11, 2007

(54) METHOD OF MANUFACTURING FLASH MEMORY DEVICE

(75) Inventor: Young Bok Lee, Kyeongki-Do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 70 days.

(21) Appl. No.: 11/129,939

(22) Filed: May 16, 2005

(65) Prior Publication Data
US 2006/0110942 A1 May 25, 2006

(30) Foreign Application Priority Data
Nov. 24, 2004 (KR) .................. 10-2004-0097158

(51) Int. Cl.
*H01L 21/31* (2006.01)
*H01L 21/469* (2006.01)

(52) U.S. Cl. ............ 438/786; 438/765; 257/E21.209
(58) Field of Classification Search ........... 438/786, 438/765; 257/E21.209
See application file for complete search history.

(56) References Cited

U.S. PATENT DOCUMENTS

| | | | | |
|---|---|---|---|---|
| 5,618,349 A | * | 4/1997 | Yuuki | 118/715 |
| 5,656,516 A | * | 8/1997 | Suzuki | 438/773 |
| 6,136,728 A | * | 10/2000 | Wang | 438/773 |
| 6,215,146 B1 | * | 4/2001 | Umeda et al. | 257/315 |
| 6,239,044 B1 | * | 5/2001 | Kashiwagi et al. | 438/787 |
| 6,468,926 B1 | * | 10/2002 | Irino et al. | 438/773 |
| 6,706,613 B2 | * | 3/2004 | You et al. | 438/424 |
| 6,780,720 B2 | * | 8/2004 | Burnham et al. | 438/287 |
| 6,821,566 B2 | * | 11/2004 | Nakamura et al. | 427/255.27 |
| 7,033,956 B1 | * | 4/2006 | Wu | 438/765 |
| 2003/0008458 A1 | * | 1/2003 | Hashimoto et al. | 438/258 |
| 2003/0020119 A1 | * | 1/2003 | Arai et al. | 257/365 |
| 2004/0102052 A1 | * | 5/2004 | Ohmi et al. | 438/765 |
| 2005/0221558 A1 | * | 10/2005 | Lee | 438/257 |

* cited by examiner

Primary Examiner—B. William Baumeister
Assistant Examiner—Igwe U. Anya
(74) Attorney, Agent, or Firm—Marshall, Gerstein & Borun LLP

(57) ABSTRACT

A method of manufacturing flash memory devices, comprises the steps of forming an oxide film on a semiconductor substrate, performing a pre-annealing process under $N_2$ gas atmosphere, nitrifying the oxide film by performing a main annealing process under $N_2O$ atmosphere having the flow rate of 5 to 15 slm for 10 to 60 minutes, thus forming an oxynitride film, and performing a post-annealing process under $N_2$ gas atmosphere.

18 Claims, 5 Drawing Sheets

| | Lot ID | Zone | Min | Max | AVG | Unif(%) in W/F | N CONCENTRATION (At,%) |
|---|---|---|---|---|---|---|---|
| REC 1 | C | U | 79.8 | 82 | 80.6 | 1.36 | 2.55 |
| | D / F | C | 79.4 | 81.5 | 80.2 | 1.31 | 2.55 |
| | F / G | L | 79.4 | 82.7 | 80.6 | 2.05 | 2.44 |
| REC 2 | C1 | U | 79.9 | 82.3 | 80.8 | 1.49 | 2.52 |
| | D1 / E1 | C | 79.6 | 81.6 | 80.3 | 1.25 | 2.38 |
| | F1 / G1 | L | 79.4 | 82.4 | 80.8 | 1.86 | 2.40 |
| REC 3 | C2 | U | 80.3 | 82.5 | 81 | 1.36 | 2.60 |
| | D2 / E2 | C | 79.4 | 81.4 | 80 | 1.25 | 2.45 |
| | F2 / G2 | L | 79.4 | 82.1 | 80.5 | 1.68 | 2.53 |

| | Lot ID | Zone | Min | Max | AVG | Unif(%) in W/F | N CONCENTRATION (At,%) |
|---|---|---|---|---|---|---|---|
| BL 1 | A / B | U | 81.5 | 83.5 | 82.3 | 1.22 | 2.44 |
| | | C | 80.2 | 82.6 | 81.1 | 1.48 | 2.24 |
| | | L | 80.4 | 83.5 | 81.6 | 1.90 | 2.31 |
| BL 2 | A1 / B1 | U | 81 | 82.9 | 81.6 | 1.16 | 2.46 |
| | | C | 80.2 | 82.3 | 80.9 | 1.30 | 2.35 |
| | | L | 80.1 | 82.8 | 81.2 | 1.66 | 2.30 |
| BL 3 | A2 / B2 | U | 80.9 | 83.1 | 81.6 | 1.35 | 2.29 |
| | | C | 80.1 | 82.4 | 80.8 | 1.42 | 2.19 |
| | | L | 80.1 | 82.8 | 81.1 | 1.66 | 2.14 |

|  | Lot ID | Zone | Min | Max | AVG | Unif(%) in W/F | N CONCENTRATION (At,%) |
|---|---|---|---|---|---|---|---|
| REC 1 | C | U | 79.8 | 82 | 80.6 | 1.36 | 2.55 |
|  | D / E | C | 79.4 | 81.5 | 80.2 | 1.31 | 2.55 |
|  | F / G | L | 79.4 | 82.7 | 80.6 | 2.05 | 2.44 |
| REC 2 | C1 | U | 79.9 | 82.3 | 80.8 | 1.49 | 2.52 |
|  | D1 / E1 | C | 79.6 | 81.6 | 80.3 | 1.25 | 2.38 |
|  | F1 / G1 | L | 79.4 | 82.4 | 80.8 | 1.86 | 2.40 |
| REC 3 | C2 | U | 80.3 | 82.5 | 81 | 1.36 | 2.60 |
|  | D2 / E2 | C | 79.4 | 81.4 | 80 | 1.25 | 2.45 |
|  | F2 / G2 | L | 79.4 | 82.1 | 80.5 | 1.68 | 2.53 |

METHOD OF MANUFACTURING FLASH MEMORY DEVICE

BACKGROUND

1. Field of the Invention

The present invention relates to a method of manufacturing flash memory devices, and more specifically, to a method of manufacturing flash memory devices, wherein the device mass production capability, erase/write (E/W) cycling characteristics and bake retention characteristics can be improved.

2. Discussion of Related Art

As the cell size shrinks and the operating voltage is lowered due to higher integration, scale-down of a tunnel oxide film is required in order to secure cell characteristics of flash memory devices.

There is, however, a limit to the scale-down of the tunnel oxide film due to data retention reliability problems. In order to overcome this limitation, an oxynitride film ($N_2O$) having better properties than a silicon oxide film ($SiO_2$) in the same thickness has been used as the tunnel oxide film instead of the silicon oxide film.

In the case where the tunnel oxide film is fabricated according to conventional technology, however, it is difficult to control a thickness and the nitrogen concentration of the tunnel oxide film, which have a great influence on the reliability, in some regions within a batch where the tunnel oxide film process proceeds. This causes the thickness of the tunnel oxide film and the nitrogen concentration of the tunnel oxide film to be profound depending upon locations within the batch. As a result, since a cell threshold voltage and characteristics vary, satisfactory erase/write (hereinafter, referred to as "E/W") cycling and bake retention characteristics cannot be obtained.

Meanwhile, in order to form a tunnel oxide film having a uniform thickness and nitrogen concentration, a tunnel oxide film process has to be performed only within a specific region of the batch. The number of lots, which can be actually processed in a batch in which 5 lots can be processed by maximum, is at most 2. Accordingly, the mass production capability is low.

Conventional problems will be below described in more detail with reference to FIGS. 1 to 3.

FIG. 1 is a table showing a thickness and a nitrogen concentration of a tunnel oxide film on a batch basis, which is fabricated according to the prior art.

Referring to FIG. 1, a tunnel oxide film process is performed in a region U within the batch, but is not carried out in regions C and L. This is because it is difficult to control a thickness and a nitrogen concentration of the tunnel oxide film in the regions C and L only through the conventional method of manufacturing the tunnel oxide film. Accordingly, although a maximum number of lots that can be processed within a single batch is 5, the number of lots that can be processed actually is at most 2 since the process is carried out only in the region U except for the regions C and L. Thus, the mass production capability is low.

As well known in the art, in the flash memory device, data are erased or written (or programmed) by injecting or drawing electrons into or from the floating gate by way of F-N tunneling. Meanwhile, when data are read, the status of a cell, i.e., a program or erase status is decided according to whether electrons exist in the floating gate or not.

As such, in the repetitive F-N process where data are programmed and erased, a cell threshold voltage is changed since electrons are trapped in the tunnel oxide film. Upon read, there arises a problem in that data stored in a cell are erroneously recognized. It is thus required that error in recognizing data not occur during at least 10K E/W (erase/writing) cycling.

FIG. 2 is a graph showing 10K E/W cycling characteristics of a conventional flash memory device.

From FIG. 2, it can be seen that after 10K E/W cycling, a program threshold voltage P shifts about 1.0V from 0.2V to 1.2V, and an erase threshold voltage E shifts about 2V from −3.8V to −1.8V. That is, excessive shift in a threshold voltage occurs. Such excessive shift in the threshold voltage is caused since the amount of charges trapped in the tunnel oxide film fabricated according to the present invention increases during 10K E/W cycling. It is thus required to improve the film quality of the tunnel oxide film.

FIG. 3 shows the test results of bake retention characteristics after 10K E/W cycling of the conventional flash memory device.

A program threshold voltage of a flash memory device in an initial state where the device is not used and a program threshold voltage of the flash memory device after 10K E/W cycling is 1.0 to 3.0V. In contrast, if a bake process is performed, for example, for 24 or 48 hours after 10K E/W cycling, as shown in FIG. 3, the range of the threshold voltage shifts about 1.0V. The program threshold voltage becomes 0.0 to 1.5V. Considering that the range of the threshold voltage upon program is 1.0 to 3.0V in a typical NAND flash memory device, the threshold voltage margin is at most 0.5V after the bake process. Thus, fail occurs in the device operating characteristics.

The main cause of the fail is that the threshold voltage is lowered since electrons trapped in the tunnel oxide film during 10K E/W cycling are de-trapped after the bake process.

SUMMARY OF THE INVENTION

Accordingly, the present invention has been made in view of the above problems, and it is an object of the present invention to provide a method of manufacturing flash memory devices, wherein a tunnel oxide film having a uniform thickness and nitrogen concentration can be fabricated regardless of locations within a batch.

Another object of the present invention is to provide a method of manufacturing flash memory devices, wherein the mass production capability can be enhanced.

Still another object of the present invention is to provide a method of manufacturing flash memory devices, wherein shift in a threshold voltage and variation in characteristics can be reduced.

Further another object of the present invention is to provide a method of manufacturing flash memory devices, wherein E/W cycling characteristics and bake retention characteristics can be improved.

To achieve the above objects, according to the present invention, there is provided a method of manufacturing a flash memory device, including the steps of (a) forming an oxide film on a semiconductor substrate, (b) performing a pre-annealing process under $N_2$ gas atmosphere, (c) nitrifying the oxide film by performing a main annealing process under $N_2O$ atmosphere having the flow rate of 5 to 15 slm for 10 to 60 minutes, thus forming an oxynitride film, and (d) performing a post-annealing process under $N_2$ gas atmosphere.

Preferably, the step (a) includes the steps of performing a wet oxidization process; and performing annealing under $N_2$ gas atmosphere to form the oxide film.

A temperature of the wet oxidization process is preferably 750 to 850° C.

Preferably, the annealing process of the $N_2$ gas atmosphere is performed at a temperature of 900 to 910° C. for 20 to 30 minutes.

A thickness of the oxide film is preferably 60 to 90 Å.

A temperature of the pre-annealing process is preferably 850 to 950° C., and a process time of the pre-annealing process is 5 to 30 minutes.

Preferably, a temperature of the main annealing process is 850 to 950° C.

A thickness of the oxynitride film is preferably 70 to 100 Å.

Preferably, a temperature of the post annealing process is 950 to 1000° C., and a process time of the post annealing process is 5 to 30 minutes.

DETAILED DESCRIPTION OF PREFERRED EMBODIMENTS

Now, the preferred embodiments according to the present invention will be described with reference to the accompanying drawings. Since preferred embodiments are provided for the purpose that the ordinary skilled in the art are able to understand the present invention, they may be modified in various manners and the scope of the present invention is not limited by the preferred embodiments described later.

FIGS. 4a to 4d are cross-sectional views showing manufacture steps of a flash memory device according to an embodiment of the present invention.

In order to fabricate the flash memory device according to an embodiment of the present invention, well ions are implanted into predetermined regions of a semiconductor substrate 10, including a high voltage region and a cell region, thus forming a well region (not shown).

For example, in the event that the semiconductor substrate 10 is a p-conduction type, $P_{31}$ ions are implanted into predetermined regions of the semiconductor substrate 10 of the p-conduction type to form a triple N well, and $B_{11}$ ions are implanted into the triple N well to form a p well.

Upon implantation of $P_{31}$ ions for forming the N well, ion implant energy is set to 1.0 to 2.0 MeV, and an ion implant concentration is set to 1.0E12 to 3.0E13 ions/cm².

Furthermore, the $B_{11}$ ion implant process for forming the P well is carried out while controlling the ion implant energy and the ion implant concentration in three steps. In other words, the first ion implant process is performed with ion implant energy of 500 to 600 KeV and ion implant concentration of 1.0E13 to 3.0E13 ions/cm², the second ion implant process is performed with ion implant energy of 200 to 300 KeV the and ion implant concentration of 1.0E13 to 3.0E13 ions/cm², and the third ion implant process is then implemented with ion implant energy of 50 to 200 KeV and ion implant concentration of 2.0E 12 to 7.0E12 ions/cm².

It is preferred that ions are implanted at a given tilt in each ion implant process. The tilt implant is preferably performed while twisting a wafer. At this time, the tilt angle is 0 to 45°, and a twist angle is 0 to 270°.

Ions for controlling the threshold voltage are then implanted to form a threshold voltage ion implant layer (not shown) on the surface of the semiconductor substrate 10.

For example, $B_{11}$ ions having the concentration of 5.0E11 to 8.0E12 are implanted into the P well with ion implant energy of 30 to 70 KeV, and $B_{11}$ ions having the concentration of 5.0E12 to 8.0E14 are implanted with ion implant energy of 10 to 30 KeV, thus forming the threshold voltage ion implant layer in the semiconductor substrate 10 in which the p well is formed. At this time, it is preferred that the ions are implanted at a given tilt in the ion implant process. The tilt implant process is preferably performed while twisting the wafer. At this time, the tilt angle is set to 0 to 45°, and the twist angle is set to 0 to 270°.

Figures 1, 2:
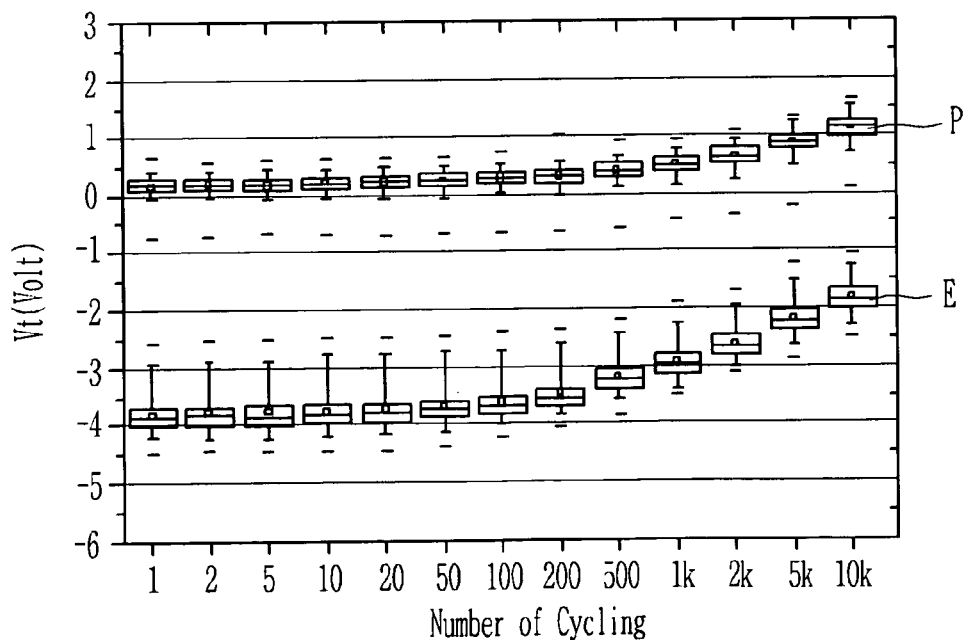
FIG. 1 is a table showing a thickness and a nitrogen concentration of a tunnel oxide film on a batch basis, which is fabricated according to the prior art.
FIG. 2 is a graph showing 10K E/W cycling characteristics of a conventional flash memory device.
Figure 3:
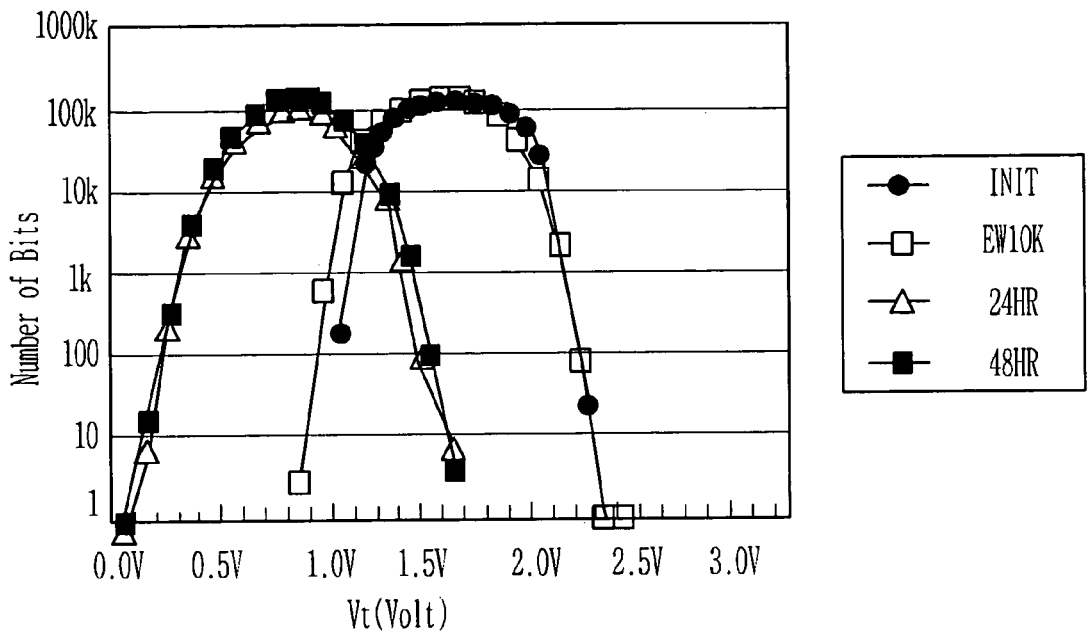
FIG. 3 shows the test results of bake retention characteristics after 10K E/W cycling of the conventional flash memory device.
Figure 4A:
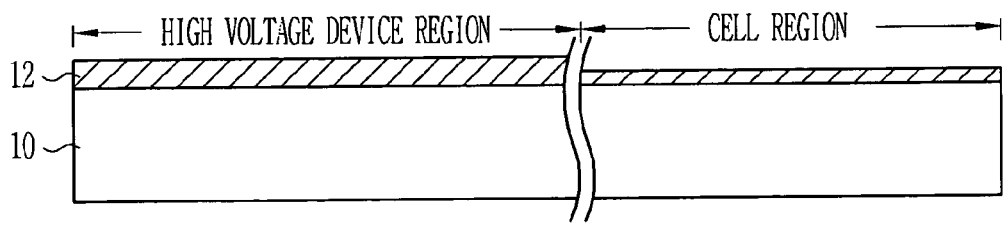
FIGS. 4a to 4d are cross-sectional views showing manufacture steps of a flash memory device according to an embodiment of the present invention.

A wet oxidization process is then performed at a temperature of 750 to 800° C., as shown in FIG. 4a. An annealing process is carried out under $N_2$ gas atmosphere having a temperature of 900 to 910° C. for 20 to 30 minutes, thereby forming a first oxide film 12 having a thickness of 300 to 400 Å on the semiconductor substrate 10.

A mask (not shown) through which the cell region is exposed is then formed on the first oxide film 12. The first oxide film 12 is removed by a given thickness by means of a wet etch process using the mask, so that the first oxide film 12 having a thickness of 15 to 45 Å remains in the cell region. At this time, in the wet etch process, $BOE+H_2SO_4+SC-1(NH_4OH/H_2O_2/H_2O)$, which are diluted at the ratio of 300:1, is used as a wet etch solution.

Figure 4B:
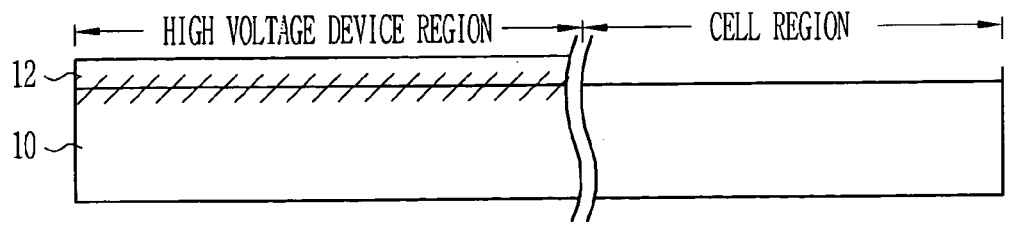

After the mask is removed, the first oxide film 12 remaining in the cell region is completely removed by means of a pre-cleaning process using HF, as shown in FIG. 4b. At this time, the first oxide film 12 of the high voltage region is also partially removed, whereby the thickness of the first oxide film 12 of the high voltage region is lowered.

Figure 4C:
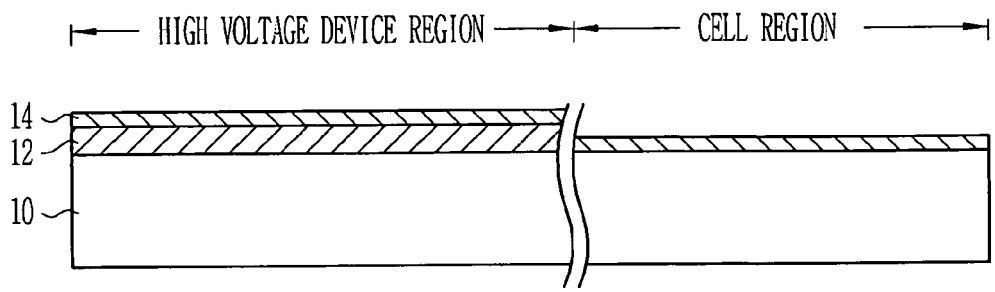

In the pre-cleaning process, $DHF+SC-1(NH_4OH/H_2O_2/H_2O)$, which are diluted at the ratio of 50:1, is used as a cleaning solution. As shown in FIG. 4c, an oxynitride film 14 is then formed on the entire surface of the semiconductor substrate 10, including the cell region, the high voltage region and the low-voltage region, by means of the tunnel oxide film process according to the present invention. As a result, a gate oxide film for the high voltage device, which is comprised of a lamination film of the first oxide film 12 and the oxynitride film 14, is formed in the high voltage region, and a tunnel oxide film consisting of the oxynitride film 14 is formed in the cell region.

The tunnel oxide film process according to the present invention is performed as follows.

After a wet oxidization process is performed, an annealing process is performed under $N_2$ gas atmosphere to form a pure oxide film having a thickness of 60 to 90 Å.

It is preferred that the pure oxide film having a thickness of 60 to 90 Å is formed under the condition in which a temperature of a wet oxidization process is 750 to 850° C., a temperature of the annealing process is 900 to 910° C., and the annealing process time is performed for 20 to 30 minutes.

Thereafter, in order to nitrify the pure oxide film, a three-step annealing process is performed.

A pre-annealing process is performed under $N_2$ gas atmosphere.

A temperature of the pre-annealing process is preferably 850 to 950° C., and a process time is preferably 5 to 30 minutes.

A main annealing process is then performed under $N_2O$ gas atmosphere. At this time, in order to improve the uniformity of a thickness and nitrogen concentration of the tunnel oxide film, the flow rate of $N_2O$ gas is 5 to 15 slm, the process time is 10 to 60 minutes, and a temperature is set to 850 to 950° C.

Thereafter, a post annealing process is performed under nitrogen ($N_2$) gas atmosphere of 950 to 1000° C. for about 5 to 30 minutes.

Figure 4D:
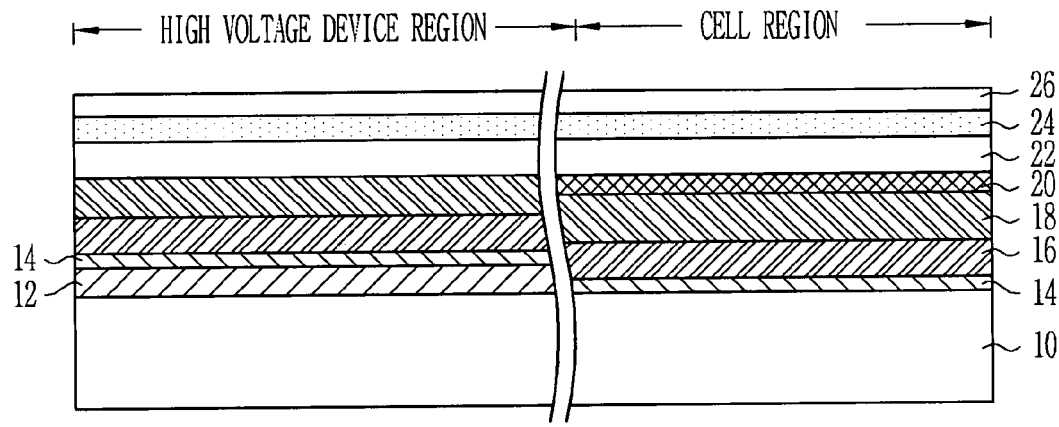

After the oxynitride film 14 for the tunnel oxide film is formed by means of the aforementioned manufacture method, a first poly silicon film 16 is formed to a thickness of 200 to 800 Å on the entire surface of the semiconductor substrate 10, and a pad nitride film (not shown) is formed on the first poly silicon film 16 in thickness of 500 Å or more, as shown in FIG. 4d.

The first poly silicon film 16 is deposited at a temperature of 530 to 680° C. and under a low pressure of 0.1 to 3.0 Torr, so that the grain size can be minimized in order to prevent concentration of electric field.

Thereafter, in order to separate the semiconductor substrate 10 into a field region and an active region, a mask through which the semiconductor substrate 10 of the field region is exposed is formed, although not shown in the drawings. The pad nitride film, the first poly silicon film 16, the oxynitride film 14, the first oxide film 12 and the semiconductor substrate 10 are etched using the mask, thus forming a trench. Then, in order to compensate for damage caused by the trench etch, a dry oxidization process is performed at a temperature of 700 to 1000° C., thereby forming a sidewall oxide film of 50 to 150 Å in thickness on the trench.

A high-density plasma (HDP) oxide film is then deposited on the entire surface including the trench. A chemical mechanical polishing (CMP) process using the pad nitride film as a target is performed to form an isolation film within the trench. The pad nitride film is then removed by means of a phosphoric acid ($H_3PO_4$) dip process.

A second poly silicon film 18 is then formed to a thickness of 1000 to 2000 Å on the entire surface of the semiconductor substrate 10. A second oxide film, a nitride film and a third oxide film are sequentially deposited on the second poly silicon film 18, thus forming an ONO film 20.

At this time, the second and third oxide films are formed by depositing a high temperature oxide (HTO) film in thickness of 40 to 60 Å at a temperature of 800 to 850° C. The nitride film is formed to a thickness of 40 to 80 Å at a temperature of 600 to 700° C.

The ONO film 20 formed in the high voltage region is then removed by means of a photolithography process.

Thereafter, a third poly silicon film 22, a tungsten silicide film 24 and a hard mask film 26 are formed on the entire surface in a sequential manner.

The third poly silicon film 22 is formed to by depositing a poly silicon film, which is doped at a level of 0.5E20 to 5.0E20 ions/cm$^2$ at a temperature of 500 to 550° C., to a thickness of 500 to 2000 Å. The tungsten silicide film 24 is formed to a thickness of 500 to 2000 Å at a temperature of 400 to 500° C. Furthermore, the hard mask film 26 is formed by stacking a PETEOS (Plasma Enhanced Tetra Ethyl Ortho Silicate) film having a thickness of 800 to 2000 Å and arcoxynitride having a thickness of 300 to 1500 Å.

Figure 4E:
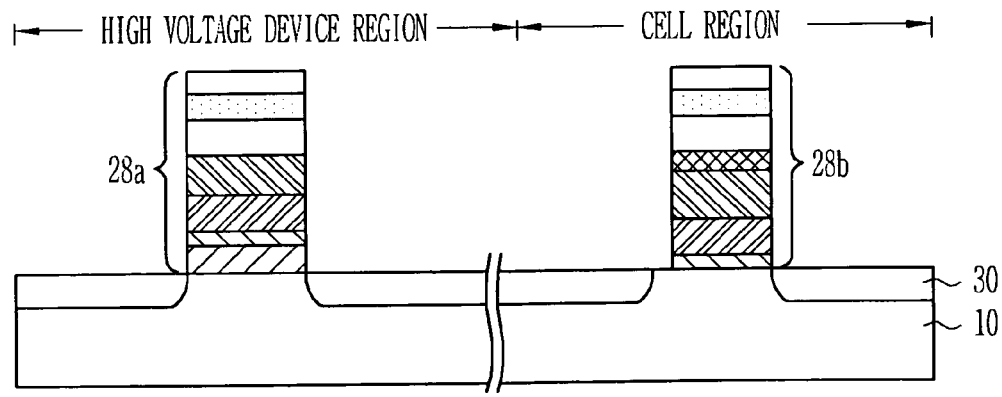

In order to form a gate, the hard mask film 26, the tungsten silicide film 24, the third poly silicon film 22, the ONO film 20, the second poly silicon film 18, the first poly silicon film 16, the oxynitride film 14 and the first oxide film 12 are selectively etched by means of a photolithography process, as shown in FIG. 4e. As a result, a gate electrode, which consists of the first poly silicon film 16, the second poly silicon film 18, the third poly silicon film 22 and the tungsten silicide film 24, a gate oxide film for the high voltage device, which consists of the first oxide film 12 and the oxynitride film 14, and a gate 28a for the high voltage device, which consists of the lamination film of the hard mask film 26 are formed on the semiconductor substrate 10 of the high voltage region. A tunnel oxide film consisting of the oxynitride film 14, a floating gate, which consists of the lamination film of the first poly silicon film 16 and the second poly silicon film 18, a control gate, which consists of the ONO film 20, the third poly silicon film 22 and the tungsten silicide film 24, and a cell gate 28b consisting of the lamination film of the hard mask film 26 are formed on the semiconductor substrate 10 of the cell region.

Thereafter, an impurity ion, for example, $P_{31}$ ions having a doping concentration of 2.0E12 to 8.0E14 ions/cm$^2$ are implanted into the semiconductor substrate 10 using the gates 28a and 28b as a mask, thus forming a source and drain junction 30 within the semiconductor substrate 10 at both sides of the gates 28a and 28b. Upon implantation of the $P_{31}$ ions, ion implant energy is set to 5 to 30 KeV, a tilt angle is set to 0 to 45°, and a twist angle is set to 0 to 270°.

Thereby, manufacture of the flash memory device according to an embodiment of the present invention is completed.

Figures 5, 6:
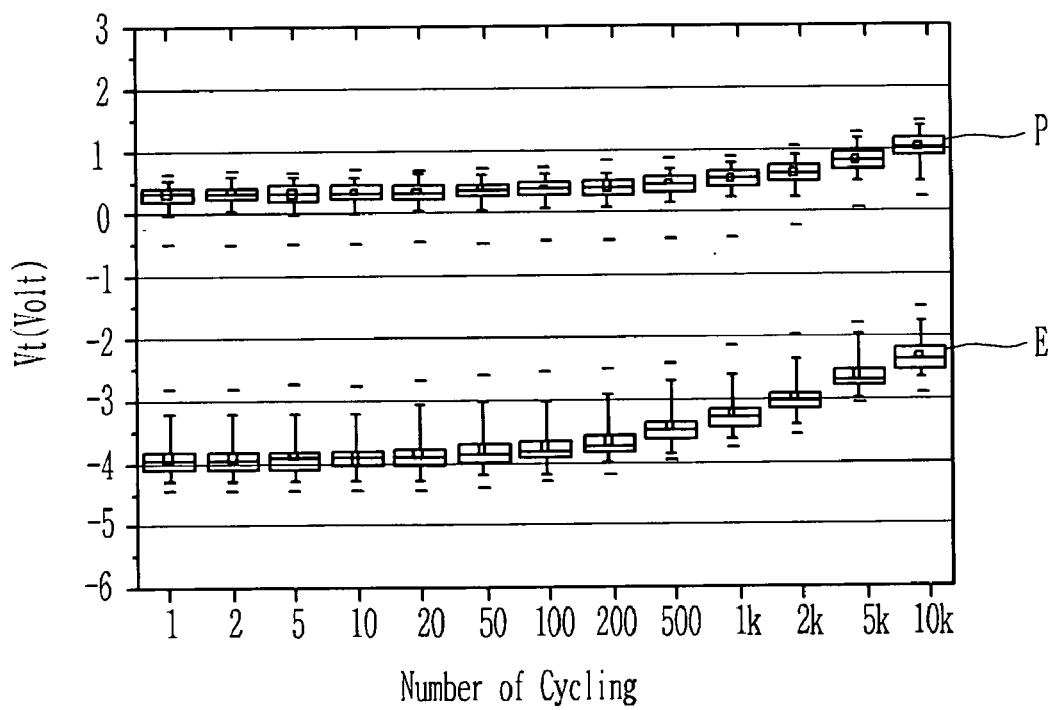
FIG. 5 is a table showing a thickness and a nitrogen concentration of a tunnel oxide film on a batch basis, which is fabricated according to the present invention.
FIG. 6 is a graph showing 10K E/W cycling characteristics of the flash memory device according to the present invention.

FIG. 5 is a table showing a thickness and a nitrogen concentration of a tunnel oxide film on a batch basis, which is fabricated according to the present invention.

As shown in FIG. 5, the tunnel oxide film process is performed even in the regions C and L as well as the region U within the batch. As such, if the manufacture method of the tunnel oxide film according to the present invention is employed, the thickness and nitrogen concentration of the tunnel oxide film can be formed uniformly regardless of locations within the batch. It is thus possible to form a tunnel oxide film even in the regions C and L on which a process is difficult to perform due to the difficulty in controlling the thickness and the nitrogen concentration of the tunnel oxide film.

As a result, the number of lots that can be processed within a single batch can increase from 2 to 5 in number. This leads to improvement in the mass production capability.

FIG. 6 is a graph showing 10K E/W cycling characteristics of the flash memory device according to the present invention.

As can be seen from FIG. 6, in the flash memory device according to the present invention, during 10K E/W cycling, a program threshold voltage P shifts around 0.6V from 0.4V to 1.0V, and an erase threshold voltage E shifts around 1.5V from −4.0V to −2.5V. Further, the threshold voltage shows a slow shift.

The reason why the threshold voltage has such a slow shift is that the shift value of the cell threshold voltage is reduced because a tunnel oxide film having a uniform thickness and nitrogen concentration can be fabricated according to the preset invention and the amount of charges trapped in the tunnel oxide film upon E/W cycling can be reduced accordingly.

Figure 7:
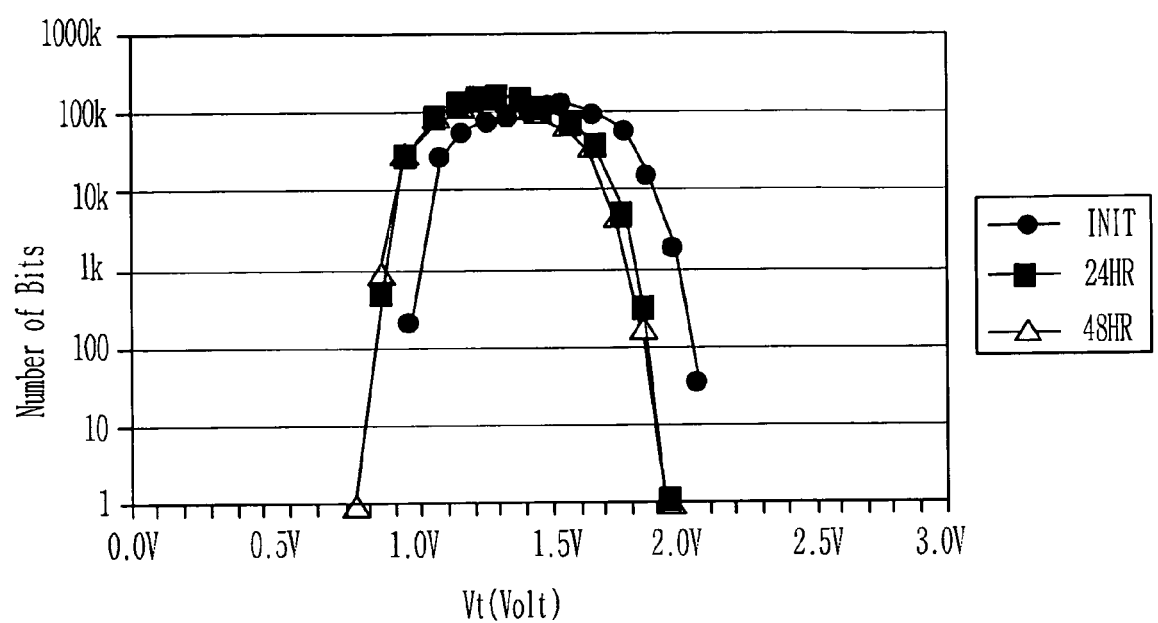
FIG. 7 shows the test results of bake retention characteristics after 10K E/W cycling of the flash memory device according to the present invention.

FIG. 7 shows the test results of bake retention characteristics after 10K E/W cycling of the flash memory device according to the present invention.

A flash memory device must operate at a threshold voltage of 1.0 to 2.2V upon program. In the flash memory device according to the present invention, the degree that the threshold voltage shifts after the bake process is performed, e.g., for 24 or 48 hours after 10K E/W cycling, as shown in FIG. 7, is 0.2V, and the shift value of the threshold voltage is reduced compared to existing technologies in which the shift value of the threshold voltage was 1.0V. As charges trapped in the tunnel oxide film are reduced upon E/W cycling, the amount of charges that are de-trapped after the bake process also reduces. Thus, the shift value of the threshold voltage reduces.

From FIGS. 6 and 7, it can be seen that the shift value of the threshold voltage by the bake process after 10K E/W cycling and 10K cycling is reduced compared to those in the prior art in the event that the manufacture process of the tunnel oxide film according to the present invention is used. In the flash memory device, reduction in the shift value of the threshold voltage means that E/W cycle characteristics and bake retention characteristics of the flash memory device are improved.

As described above, according to the present invention, the following effects can be obtained.

Firstly, as a thickness and nitrogen concentration of a tunnel oxide film can be made uniform regardless of locations within a batch, the number of lots that can be processed within a single batch is increased. Accordingly, the mass production capability can be enhanced.

Secondly, the shift value of a threshold voltage due to repetitive program/erase (P/E) cycle and bake processes can be reduced. It is thus possible to improve E/W cycling characteristics and bake retention characteristics.

Thirdly, since E/W cycling characteristics and bake retention characteristics are improved, flash memory devices having high reliability can be fabricated.

Although the foregoing description has been made with reference to the preferred embodiments, it is to be understood that changes and modifications of the present invention may be made by the ordinary skilled in the art without departing from the spirit and scope of the present invention and appended claims.

What is claimed is:

1. A method of manufacturing a flash memory device, comprising the steps of:
    forming an oxide layer over a semiconductor substrate by performing a pre-annealing process; and
    forming a nitride oxide layer by performing first, second, and third annealing processes over the oxide layer,
    wherein the second annealing process is performed under $N_2O$ gas atmosphere for 10 minutes to 60 minutes.

2. The method as claimed in claim 1, wherein the step of forming the oxide layer further includes the step of performing a wet oxidization process-before the pre-annealing process.

3. The method as claimed in claim 2, wherein the wet oxidization process is carried out at a temperature of 750° C. to 850° C.

4. The method as claimed in claim 2, comprising performing the pre-annealing process under $N_2$ gas atmosphere at a temperature of 900° C. to 910° C. for 20 minutes to 30 minutes.

5. The method as claimed in claim 1, wherein a thickness of the oxide layer is 60Å to 90Å.

6. The method as claimed in claim 1, comprising performing the first annealing process at a temperature of 850° C. to 950° C. under $N_2$ gas atmosphere for 5 minutes to 30 minutes.

7. The method as claimed in claim 1, wherein the second annealing process is performed at a temperature of 850°. to 950° C.

8. The method as claimed in claim 1, wherein a thickness of the nitride oxide layer is 70Å to 100 Å.

9. The method as claimed in claim 1, comprising performing the third annealing process at a temperature of 950° C. to 1000° C. under $N_2$ gas atmosphere for 5 minutes to 30 minutes.

10. The method as claimed in claim 1, wherein the second annealing is performed at a flow rate of 5 slm to 15 slm.

11. A method of manufacturing a flash memory device, comprising the steps of:
    forming a first dielectric layer for a high voltage on a semiconductor substrate defining cell, low voltage, and high voltage regions;
    removing the first dielectric layer formed in the cell and low voltage regions; and
    forming a second dielectric layer in the cell, low voltage, and high voltage regions by performing a wet oxidization process and a plurality of annealing processes using an atmosphere including $N_2$,
    wherein the plurality of annealing processes includes a first annealing process, a second annealing process, and a third annealing process and the second annealing process is performed under $N_2O$ gas atmosphere for 10 minutes to 60 minutes.

12. The method as claimed in claim 11, comprising performing the wet oxidization process at a temperature of 750° C. to 850° C.

13. The method as claimed in claim 11, comprising performing the first annealing process at a temperature of 850° C. to 950° C. under $N_2$ gas atmosphere for 5 minutes to 30 minutes.

14. The method as claimed in claim 11, wherein the second annealing process is performed at a temperature of 850° C. to 950° C., and an $N_2O$ gas flow rate of 5 slm to 15 slm.

15. The method as claimed in claim 11, comprising performing the third annealing process at a temperature of 950° C. to 1000° C. under $N_2$ gas atmosphere for 5 minutes to 30 minutes.

16. The method as claimed in claim 11, wherein the second dielectric layer includes a pure oxide layer and a nitride oxide layer.

17. The method as claimed in claim 16, wherein a thickness of the pure oxide layer is 60Å to 90Å and a thickness of the nitride oxide layer is 70Å to 100 Å.

18. The method as claimed in claim 11, further including the steps of:
    forming a first poly-silicon layer and pad nitride layer on the second dielectric layer;
    forming an isolation structure;
    forming a second poly-silicon layer, an ONO (Oxide-Nitride-Oxide) layer, a third polysilicon layer, a tungsten silicide layer, and a hard mask;
    forming a gate electrode; and
    forming source and drain regions by ion implanting using the gate electrode as a mask.

* * * * *